(12) United States Patent (10) Patent No.: US 9,141,879 B2
Ushiba et al. (45) Date of Patent: Sep. 22, 2015

(54) PATTERN MATCHING METHOD, IMAGE PROCESSING DEVICE, AND COMPUTER PROGRAM

(75) Inventors: Hiroyuki Ushiba, Hitachi (JP); Yasutaka Toyoda, Mito (JP); Yuichi Abe, MIto (JP); Mitsuji Ikeda, Hitachinaka (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 210 days.

(21) Appl. No.: 13/807,664

(22) PCT Filed: May 30, 2011

(86) PCT No.: PCT/JP2011/002991
§ 371 (c)(1),
(2), (4) Date: Apr. 10, 2013

(87) PCT Pub. No.: WO2012/001876
PCT Pub. Date: Jan. 5, 2012

(65) Prior Publication Data
US 2013/0216141 A1 Aug. 22, 2013

(30) Foreign Application Priority Data
Jul. 1, 2010 (JP) ................................. 2010-150711

(51) Int. Cl.
*G06K 9/00* (2006.01)
*G06K 9/62* (2006.01)
(Continued)

(52) U.S. Cl.
CPC .............. *G06K 9/6201* (2013.01); *G01B 15/00* (2013.01); *G06K 9/3241* (2013.01); *G06K 9/6223* (2013.01); *G06K 9/74* (2013.01); *G06T 7/001* (2013.01); *G06T 7/003* (2013.01); *H01J 37/28* (2013.01); *G06T 2207/10061* (2013.01);
(Continued)

(58) Field of Classification Search
None
See application file for complete search history.

(56) References Cited

U.S. PATENT DOCUMENTS 7,151,855 B2 12/2006 Mitsui
8,041,104 B2 10/2011 Toyoda et al.
(Continued)

FOREIGN PATENT DOCUMENTS

JP 05-205058 A 8/1993
JP 05-324836 A 12/1993
(Continued)

OTHER PUBLICATIONS

International Search Report issued in International Patent Application No. PCT/JP2011/002991 dated Aug. 2, 2011.

*Primary Examiner* — Randolph I Chu
(74) *Attorney, Agent, or Firm* — McDermott Will & Emery LLP

(57) ABSTRACT

In order to provide a computer program, an image processing device, and a pattern matching method that perform pattern matching at a high level of accuracy without relying on edge deformation, contrast fluctuations, etc., in one embodiment, the disclosed pattern matching method and device perform pattern matching over an image using a template produced on the basis of the below mentioned design data. The pattern matching method and device determine the characteristic quantities of the image for an inner region and/or an outer region that are divided by a line that defines the contour of a pattern, and determine positions at which said characteristic quantities satisfy predetermined conditions to be matching positions, matching position candidates, or erroneous matching positions.

14 Claims, 15 Drawing Sheets

(51) Int. Cl.
*G01B 15/00* (2006.01)
*H01J 37/28* (2006.01)
*G06T 7/00* (2006.01)
*G06K 9/32* (2006.01)
*G06K 9/74* (2006.01)

(52) U.S. Cl.
CPC ............. *G06T2207/20036* (2013.01); *G06T 2207/30148* (2013.01); *H01J 2237/221* (2013.01); *H01J 2237/2817* (2013.01)

(56) References Cited

U.S. PATENT DOCUMENTS

| | | | |
|---|---|---|---|
| 2007/0248258 A1* | 10/2007 | Mitsui | 382/151 |
| 2011/0262043 A1* | 10/2011 | Sato et al. | 382/209 |
| 2012/0328181 A1* | 12/2012 | Kitamura et al. | 382/145 |
| 2014/0016854 A1* | 1/2014 | Nagatomo et al. | 382/149 |

FOREIGN PATENT DOCUMENTS

| | | |
|---|---|---|
| JP | 2003-162718 A | 6/2003 |
| JP | 2004-117204 A | 4/2004 |
| JP | 2007-140729 A | 6/2007 |
| JP | 2007334702 A | 12/2007 |
| JP | 2008-151607 A | 7/2008 |
| JP | 2008-294451 A | 12/2008 |

\* cited by examiner

1001 AREA OF INTEREST
1003 REDUCTION
1005 VECTORIZATION
1002 EXPANSION
1004 THIN LINING
1006 AREA OF INTEREST (EXTERNAL AREA)

1101 UPPER LAYER INTERNAL AREA
1102 LOWER LAYER INTERNAL AREA
1103 EXTERNAL AREA

PATTERN MATCHING METHOD, IMAGE PROCESSING DEVICE, AND COMPUTER PROGRAM

TECHNICAL FIELD

The present invention relates to an image processing device that processes an image signal obtained by a scanning electron microscope, etc., and particularly relates to a template matching method on an image, an image processing device that realizes the template matching method, and a computer program.

BACKGROUND ART

Conventionally, a technology in which a certain given shape (template) is searched for in a target image has been widely used as template matching.

In measurement of a pattern on a semiconductor wafer using a scanning electron microscope, the template matching is performed in order to obtain a measurement position (see Patent Literature 1). Rough position alignment of a measurement position is performed by movement of a stage on which a wafer is mounted, however, in positioning accuracy of a stage, large deviation occurs on an image that is captured with high magnification by an electron microscope. In order to perform measurement in an accurate position by correcting the deviation, the template matching is performed.

However, there is a case in which an appropriate matching position is not obtained because matching is not performed appropriately due to unexpected reflection of a lower layer pattern. Therefore, a method in which matching processing is performed using only an edge of design data has been proposed (see Patent Literature 2). In this method, matching is performed by using only an edge that is obtained from design data, and correlation calculation is ignored in the other areas, so that reduction of a correlation value due to reflection of a lower layer pattern can be suppressed.

CITATION LIST

Patent Literature

Patent Literature 1: JP-A-2008-294451
Patent Literature 2: JP-A-2007-334702

SUMMARY OF INVENTION

Technical Problem

However, in the matching method that is discussed in Patent Literature 2, the matching is performed using only information of an edge portion, so that, for example, in a case of a pattern having many line widths and space widths arranged at the same distance (line and space pattern), it is probable that a position that is shifted by a half cycle is erroneously recognized as a matching position. As described above, in some types of a pattern, there is matching processing in which accuracy of the matching is further improved by using an area other than the edge as well. In addition, when a pattern width is significantly different from design data due to process variability, etc., it is probable that accuracy of the matching is reduced.

A pattern matching method, an image processing device, and a computer program with the purpose that pattern matching is performed highly accurately regardless of deformation of an edge, variability of contrast, etc. are described below.

Solution to Problem

As an aspect to attain the above-described object, a pattern matching method or a device are proposed below in which pattern matching is performed on an image using a template that is formed on the basis of design data, and in the pattern matching method, the device, and a computer program, for an internal area and/or an external area that are segmented by a line segment that defines the contour of a pattern, a characteristic quantity of the image is obtained, a position in which the characteristic quantity satisfies a certain condition is determined as a matching position, a matching position candidate, or an erroneous matching position. The certain condition is, for example, a parameter that indicates variation in brightness in the above-described area. For example, when there is an area in which it is determined that the variation is relatively small with respect to another portion, or that no variation is found, the matching position is identified on the basis of the determination.

Advantageous Effects of Invention

According to the above-described configuration, pattern matching can be performed highly accurately regardless of deformation of an edge, variability of contrast, etc.

DESCRIPTION OF EMBODIMENTS

Figure 3:
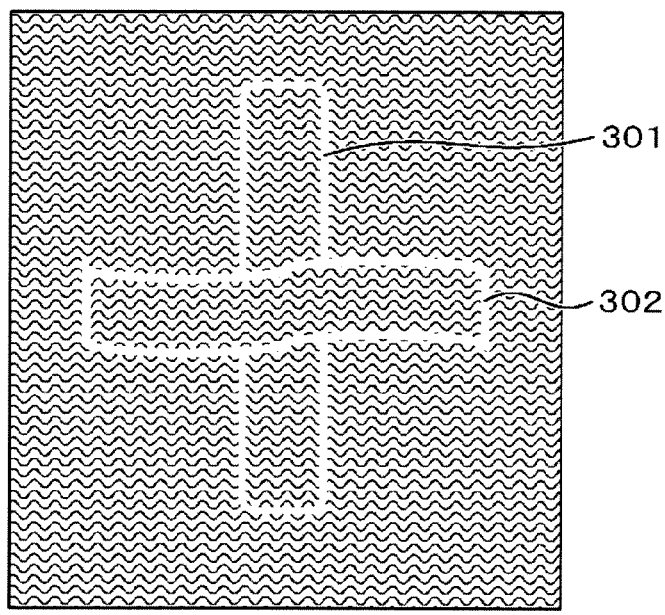
FIG. 3 is a diagram illustrating an example of a captured image of a pattern.

For example, when pattern matching is performed selectively using an edge portion, reflection of a lower layer pattern can be suppressed, however, it is probable that there is a case in which matching is not performed appropriately when deformation of the pattern is large because information other than that of the edge is removed. As illustrated in FIG. 3, when a part of a pattern that is matching target is collapsed on an SEM image, it is probable that a correlation value that is required for the matching calculation is decreased. In the example of FIG. 3, a lower layer pattern 301 has a shape close to design data, however, an upper layer pattern 302 is deformed.

Figure 4:
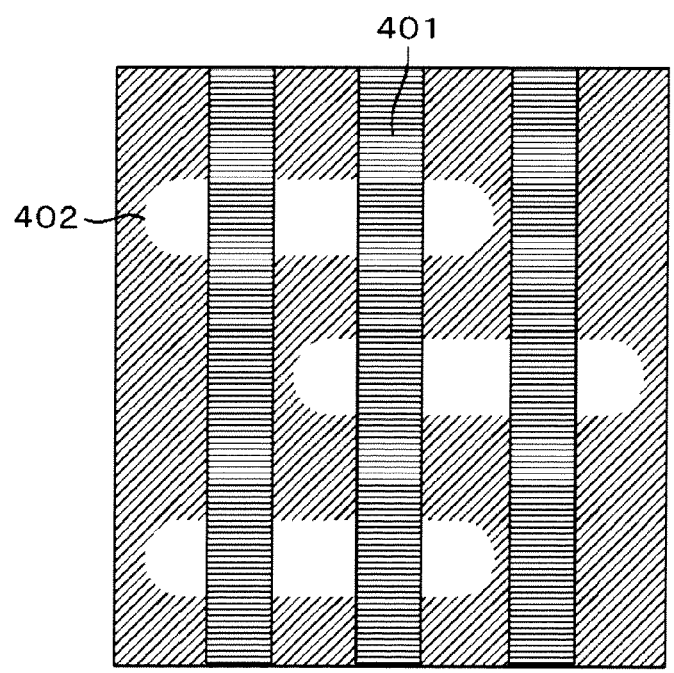
FIG. 4 is a diagram illustrating an example of a captured image of a pattern.

In addition, as illustrated in FIG. 4, when a relatively vertically (Y direction) long pattern 401 and a relatively horizontally (X direction) long pattern 402 overlap and these patterns are repeated with the same cycle as the pattern widths, it is probable that a position that is shifted from the original matching position is recognized as the matching position because an edge shape is the same as that in a position that is shifted by a half cycle when pattern matching is performed selectively using an edge portion. In a semiconductor pattern, a pattern in which a vertical line, a horizontal line, etc. is simply repeated is often used, and in a case in which some layers are reflected to the SEM image as illustrated in the patterns 301 and 302, and the patterns 401 and 402, a matching success rate is reduced due to the combined influence.

In addition, recently, complication and multi-layering of a semiconductor device pattern has been advanced, and the influence based on shape deformation such as distortion of a pattern, collapse of a pattern, etc. has been becoming large, thereby causing a factor of reduction of matching accuracy. For such reduction of matching accuracy, it is conceivable that shape deformation and edge strength of a template is set by performing simulation or manually set by a user to thereby improve a matching success rate, however, there arises a concern of an increase in a computational cost and lack of manpower.

A pattern matching method, a device that realizes the pattern matching method, and a computer program are described below in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, and a step of comparing the statistical quantity with a threshold value and determining a matching position.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a profile based on brightness of the image area, and a step of comparing the shape of the profile with a certain profile and determining a matching position.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points, and selecting a matching candidate by comparing the statistical quantities.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points and performing clustering by comparing the statistical quantities with a threshold value, and a step of selecting a correct matching candidate in a class that is obtained by the clustering.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points and performing clustering by comparing the statistical quantities, and a step of selecting a correct matching candidate in a class that is obtained by the clustering.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, and a step of determining erroneous matching by comparing the statistical quantity with a threshold value.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points and determining failure of matching by comparing the statistical quantities.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points, a step of determining whether or not to perform clustering for the candidate point, a step of performing clustering by comparing the statistical quantity and a threshold value or comparing the statistical quantities, and a step of selecting a correct matching candidate in a class that is obtained by the clustering.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, a step of calculating the statistical quantities for at least two or more candidate points, a step of changing a clustering method depending on the statistical quantity, a step of performing clustering by comparing the statistical quantity and a threshold value or comparing the statistical quantities, and a step of selecting a correct matching candidate in a class that is obtained by the clustering.

It is noted that, as the above-described step of selecting a correct matching candidate from a class, an example is described in which one matching candidate is selected from the matching candidates in the class using the statistical quantity.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, a step of calculating a statistical quantity of information based on brightness of the image area, and a step of determining a matching position on the basis of a comparison result of the statistical quantity and a threshold value or a comparison result of the two or more statistical quantities, and on a result of image correlation.

It is noted that, as the above-described step of selecting a correct matching candidate from a class, an example is also described in which one matching candidate is selected from the matching candidates in the class using the result of image correlation. In addition, as the above-described step of selecting a correct matching candidate from the a class, an example is also described in which one matching candidate is selected from the matching candidates in the class on the basis of the statistical quantity and the result of image correlation.

In addition, as another aspect, a pattern matching method, a device that realizes the pattern matching method, and a computer program are described in detail, the pattern matching method in which pattern matching is performed between an image that is obtained by capturing an electronic device, etc. and a reference pattern that is formed on the basis of design data, including: a step of identifying at least one or more of image areas on the image which correspond to an internal or external area of the reference pattern, and a step of determining a matching position using the image area. It is noted that, as the above-described step of determining a matching position using the image area, an example is also described in which the pattern matching method includes at least one of the step of performing image correlation calculation, the step of calculating a statistical quantity of information based on brightness of the image area, and the step of calculating a profile based on brightness of the image area. It is noted that, as a the above-described step of determining a matching position using the image area, an example is described in which the matching position is determined based on at least one of a value on the basis of the image correlation calculation, a comparison result of the statistical quantities that are obtained from the image area, and a comparison result of the profiles that are obtained from the image area.

In addition, as the above-described step of determining a matching position by comparing a profile shape and a certain profile, an example is also described in which the matching position is determined by comparing a profile that is given on the basis of an optional profile or design data and the profile.

In addition, a user interface for determining whether or not to execute the method is also described.

According to the above-described methods, for a complex pattern and a multilayer pattern, a matching success rate can be improved. In addition, a computational cost is not increased so much, and a time for re-examination is significantly reduced, thereby reducing a time that is required for the whole processes. In addition, by increasing the matching success rate, the burden of a user is reduced, thereby improving the operability.

Figure 1:
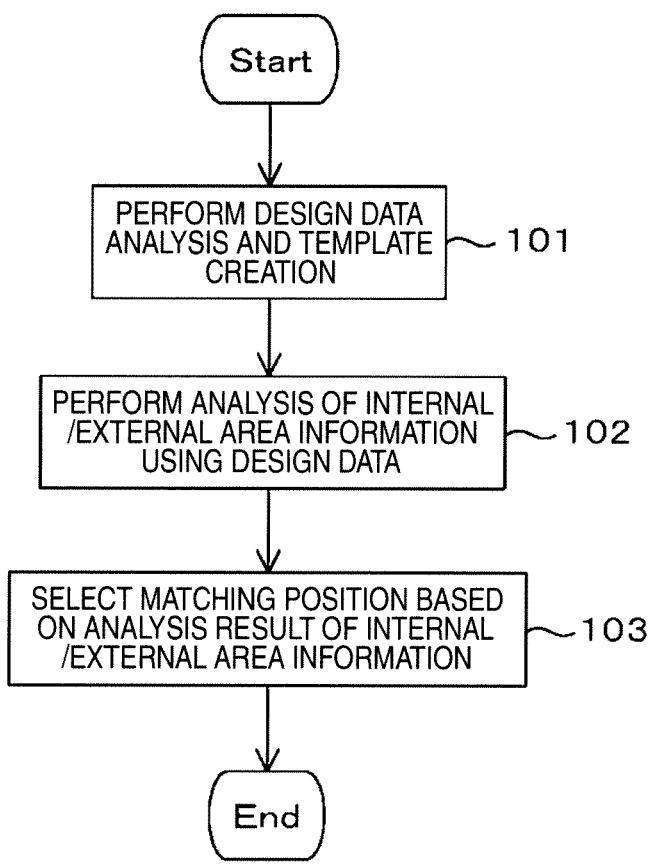
FIG. 1 is a flowchart illustrating a pattern matching process.

FIG. 1 is a flowchart illustrating a template creation process and a pattern matching process. The pattern matching method that is described below includes: a step of performing design data analysis and template creation (step 101), a step of performing analysis of internal/external area information using the design data (step 102), and a step of selecting a matching position based on an analysis result of the internal/external area information (step 103).

In embodiments that are described below, with reference to accompany drawings, a matching method, a device that realizes the pattern matching method, and a computer program are described, the matching method including: selectively evaluating a characteristic quantity that is obtained from an area (internal or external area of a pattern) that is segmented by a line segment that defines a pattern that is mainly obtained on the basis of design data, and determining a position in which the characteristic quantity satisfies a certain condition.

First Embodiment

A pattern matching method according to a first embodiment can be applied to a system that performs measurement or examination of a semiconductor device. For example, in a measurement or examination process of a semiconductor device, measurement of dimensions, examination of a defect, etc. of design data and a pattern that is formed on a semiconductor device is performed. In the first embodiment, an example is described in which a template is created that is applied to pattern matching for identifying a measurement or examination position is created using design data that includes a portion on which measurement or examination is performed. It is noted that, an example is described below in which a desired pattern is searched for from an image captured by a scanning electron microscope (hereinafter, referred to as an SEM), however, the embodiment are not limited to the example. For example, the embodiment can also be applied to a case in which a desired pattern is searched for from an image obtained by another image forming device (for example, a focused ion beam (FIB) device, which is a kind of a charged particle beam device).

Design data is a design drawing of a semiconductor circuit. Design data is represented, for example, by a GDS format, by an OASIS format, etc., and is stored with a certain format. It is noted that, in design data, any type is available as long as software that displays design data can display the format and the design data is treated as graphic data. The image processing device that is described in the first embodiment may be integrated with a control device of the SEM that is a kind of an image forming device, and may be a separated computer that includes a storage medium that accumulates image signals that are obtained by the SEM, includes a processor that executes a program for performing matching on the image signal or a dedicated processor, and is connected to the SEM through a network, etc.

Figure 2:
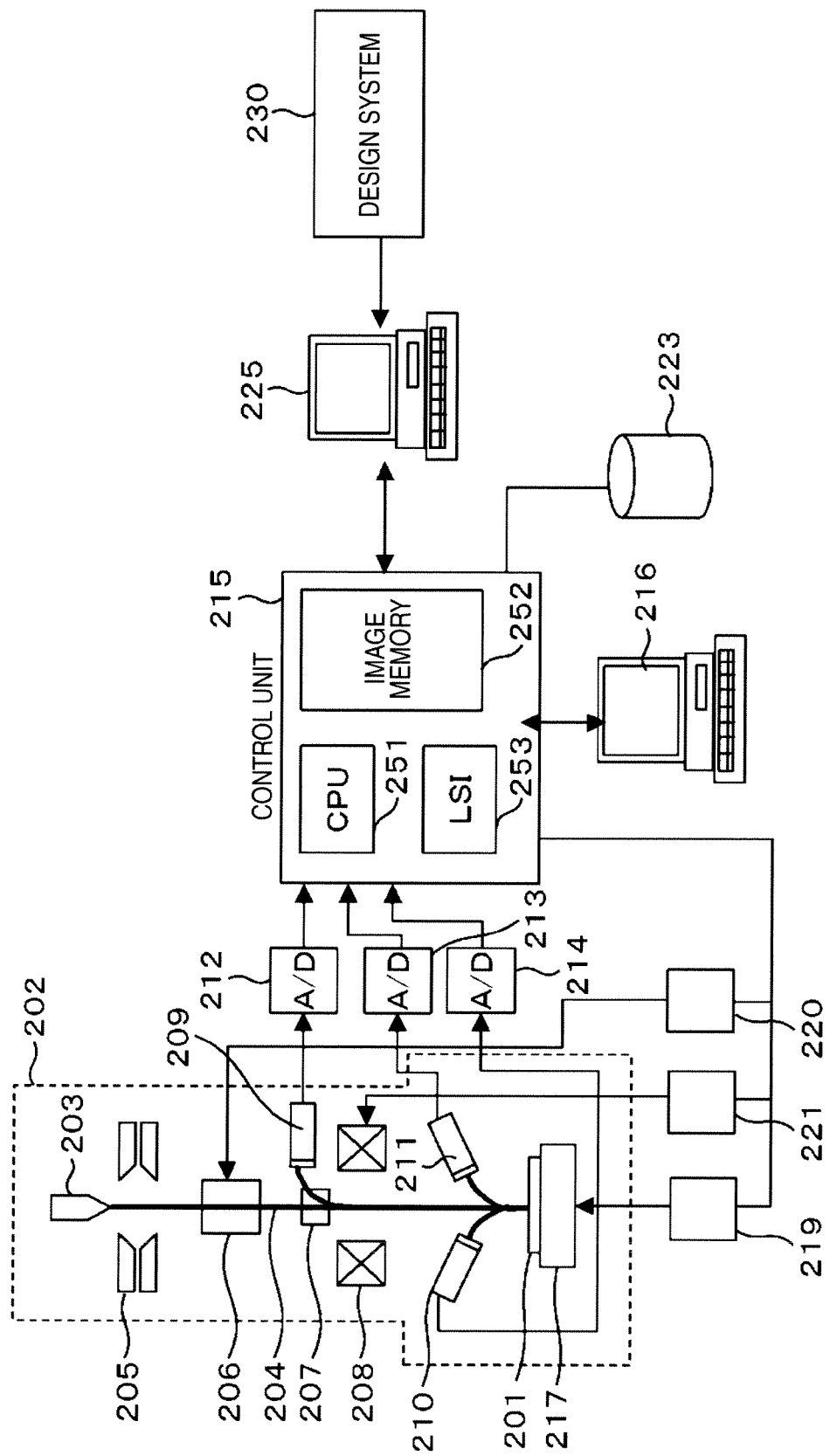
FIG. 2 is a schematic diagram illustrating a measurement or examination system that performs pattern matching.

FIG. 2 is a schematic diagram illustrating a measurement or examination system that performs pattern matching. An electron optical system 202 includes an electron gun 203 that generates an electron beam (primary electron) 204, a condenser lens (not illustrated) that focuses the electron beam 204 that is extracted from the electron gun 203 by an extraction electrode 205, a deflector 206 that deflects the focused electron beam 204, an ExB deflector 207 for detecting a secondary electron, and an objective lens 208 that images the focused electron beam on a semiconductor wafer 201.

The semiconductor wafer 201 is mounted on an XY stage 217. As a result, the deflector 206 and the objective lens 208 control an irradiation position and aperture of electron beam so that the electron beam is focused and irradiated at an optional position on the semiconductor wafer 201 that is mounted on the XY stage 217. The XY stage 217 moves the semiconductor wafer 201 and enables image capturing of the optional position of the semiconductor wafer 201.

Therefore, change of observation position by the XY stage 217 is referred to as stage shift, and change of an observation position by deflection of electron beam by the deflector 206 is referred to as beam shift. On the other hand, a secondary electron and a reflection electron are emitted from the semiconductor wafer 201 subjected to the electron beam irradiation, and the secondary electron is detected by a secondary electron detector 209. On the other hand, the reflection electrons are detected by reflection electron detectors 210 and 211.

It is noted that the reflection electron detectors 210 and 211 are installed on different positions, respectively. The secondary electron and the reflection electrons that are detected by the secondary electron detector 209 and the reflection electron detectors 210 and 211, respectively, are converted into digital signals in A/D converters 212, 213, and 214, input to a processing control unit 215, stored in an image memory 252, and subject to image processing by a CPU 251, image processing hardware, etc. in accordance with a purpose to measure of a circuit pattern.

That is, the processing control unit 215 transmits a control signal to a stage controller 219 and a deflection control unit 220 in order to image an examination point on the basis of an imaging recipe that is created by an imaging recipe creation unit 225, which is described later, and that indicates a measuring procedure of a pattern, and performs processing and control such as various pieces of image processing on an observation image on the semiconductor wafer 201 to perform positioning by pattern matching.

It is noted that the processing control unit 215 is connected to the stage controller 219 that performs control of the position and the movement of the XY stage 217 including global alignment control in which the original point shift and rotation of the semiconductor wafer 201 is corrected by observing a global alignment mark on the semiconductor wafer 201 by an optical microscope (not illustrated), etc., the deflection control unit 220 that controls beam shift (beam deflection) of electron beam by controlling the deflector 206, and a focus control unit 221 that performs focus control by controlling the objective lens 208. In addition, the processing control unit 215 includes a function of a graphical user interface (GUI), etc. that is connected to a display 216 including input means and that displays an image and a measuring result, etc. to the user. It is noted that the embodiment in which there is provided two detectors of a reflection electron image is described, but the number of detectors of a reflection electron image may be increased or decreased. In addition, the process and control of the processing control unit 215 may be performed by allocating a part or all of the control in the processing control unit 215 to the CPU, an electronic computer, etc. on which a memory that can accumulate images is mounted.

The processing control unit 215 is connected to an imaging recipe creation unit 225 that creates an imaging recipe including information, etc. such as coordinates of a circuit pattern, a template of design data for positioning which corresponds to the coordinates, an imaging condition of SEM observation (including imaging magnification, an image quality, etc.), through a network, a bus, etc. The imaging recipe creation unit 225 is connected to a design system 230 such as an electronic design automation (EDA) tool through the network, etc. in order to obtain design data. The imaging recipe creation unit 225 creates an imaging recipe using design data from information of an imaging point on a wafer to be measured, and corresponds, for example, to an imaging recipe creation device that is disclosed in JPA-2006-3517146. A concept that an imaging recipe is created from design data has been proposed through the ages, and a method and a device that create an imaging recipe from design data is not limited thereto. Generally, creation of an imaging recipe is performed by software processing of an electronic computer on which a CPU, a memory, etc. is mounted or hardware processing on which a CPU, an ASIC, an FPGA, a memory, etc. is mounted.

It is noted that, instead of the design system 230, an exposure simulator may be connected to the imaging recipe creation unit 225 to cause the imaging recipe creation unit 225 to read line segment information that indicates the contour of a pattern. As described later, in the first embodiment, a matching position is determined by selectively extracting internal and/or external area information of a pattern and evaluating a characteristic quantity. A line segment of layout data of a pattern that is included in GDS data indicates an ideal shape of the pattern, however, an actually formed pattern does not always necessarily coincide with the layout data. Therefore, matching accuracy can be further improved by defining a pattern line segment that has a shape closer to the shape of an actual pattern and that is based on simulation as a borderline of internal and/or external area of a pattern. It is noted that simulation data is also is formed on the basis of the design data.

Figure 5:
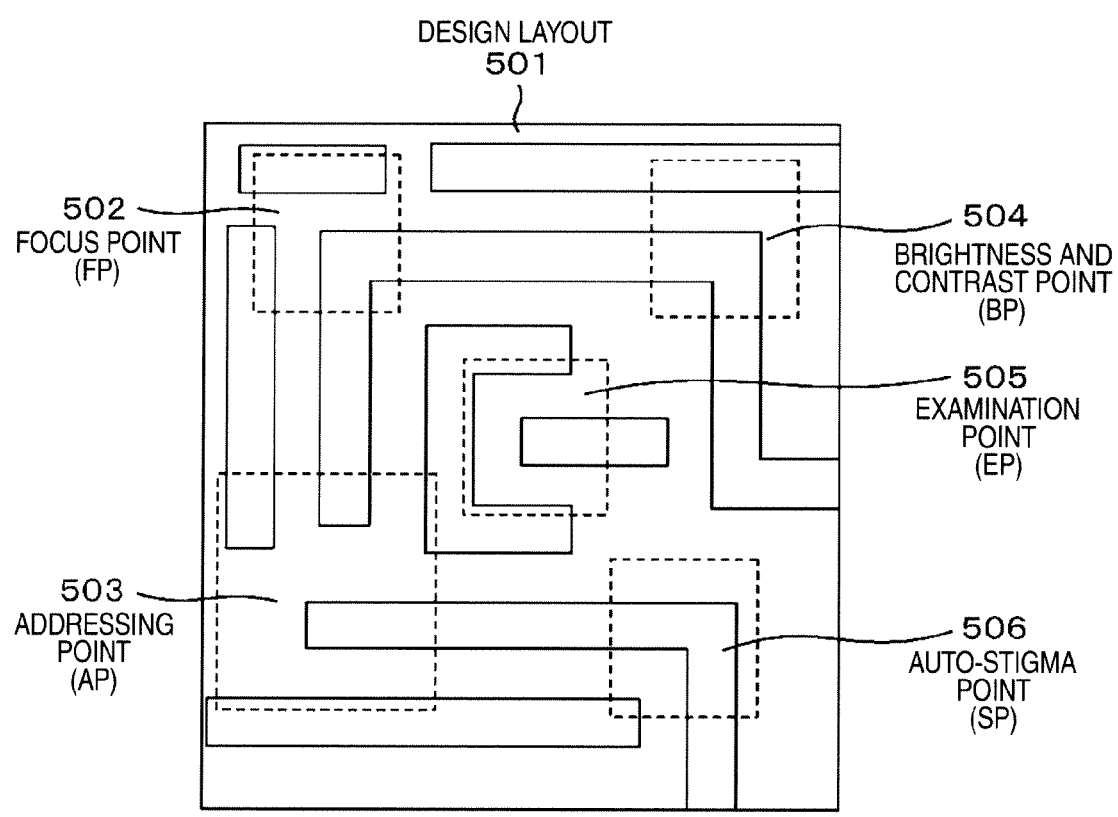
FIG. 5 is a diagram illustrating a setting example of an optical condition adjustment area and a measurement or examination point on layout data.
Figure 20:
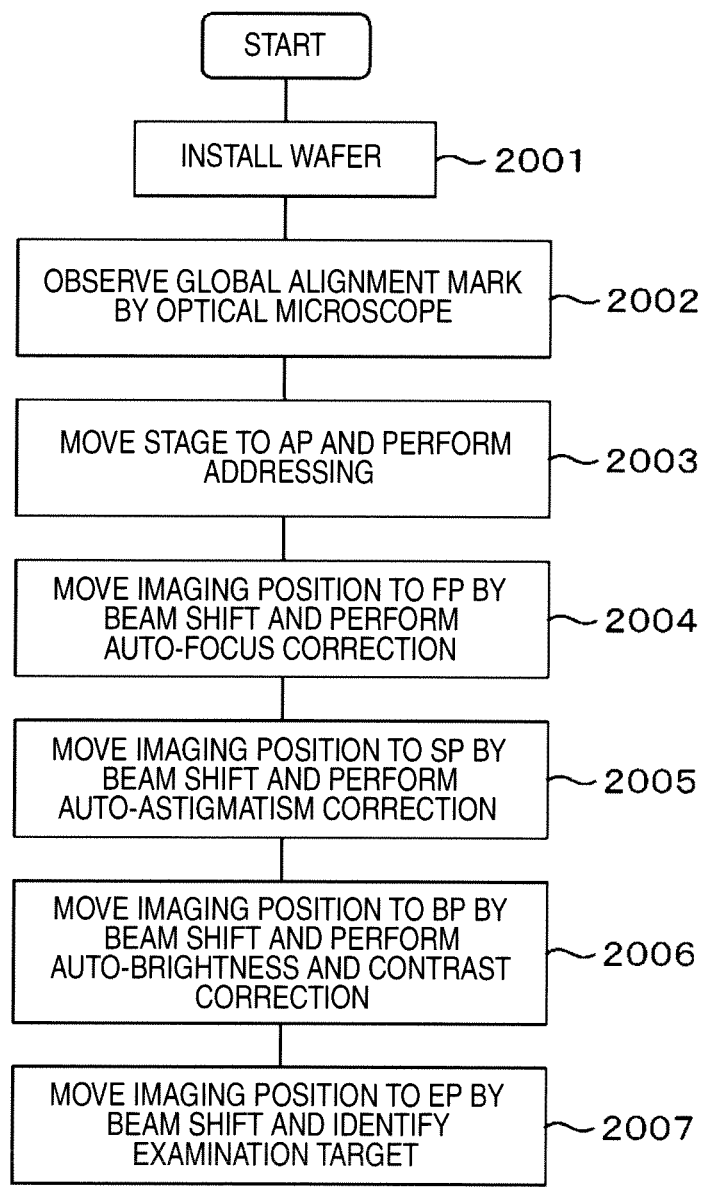
FIG. 20 is a flowchart illustrating an imaging sequence of the SEM.

Next, an imaging sequence for observing an optional examination point on a wafer (hereinafter, referred to as EP) is described with reference to FIG. 20. In addition, FIG. 5 is a diagram illustrating a setting example of an optical condition adjustment area and a measurement or examination point on layout data, and the diagram illustrating a setting example of an addressing point (hereinafter, referred to as AP) 503, an auto-focus point (hereinafter, referred to as FP) 502, a stigma correction point (hereinafter, referred to as SP) 506, and a brightness and contrast correction point (hereinafter, referred to as BP) 504, for an EP 505 on design layout 501. An imaging location, an imaging condition (including imaging magnification, an image quality, etc.) in the imaging sequence, and a measuring condition in the EP are created as imaging recipes in the imaging recipe creation unit 225 on the basis of the design data and information of an examination point are stored and arranged, for example, in a storage device 223.

First, the semiconductor wafer 201 is installed on the XY stage 217 (step 2001). After that, the processing control unit 215 calculates original point shift and rotation shift of a sample by observing a global alignment mark on the sample by an optical microscope (not illustrated), etc., and controls the XY stage 217 on the basis of the shift amounts through the stage controller 219 to correct coordinate shift, etc. of the sample (step 2002). After that, the processing control unit 215 moves the XY stage 217, moves an imaging position to an AP and performs imaging under an imaging condition having lower magnification than that at the time of EP imaging in accordance with coordinates of an imaging point that is created by the imaging recipe creation unit 225 and an imaging condition (step 2003).

The AP is described below. When a visual field is directly positioned in an EP without performing position identification using an AP, it is probable that an observation location is shifted from a visual field of the SEM due to positioning accuracy, etc. of a stage. Therefore, an image of an AP is prepared beforehand which is created for positioning in the imaging recipe creation unit 225, is registered with the storage device 223, and the coordinates of which is known. In the processing control unit 215, matching is performed between a design data template in the AP that is created by the imaging recipe creation unit 225 beforehand and stored in the storage device 223 and an SEM image of an area including an AP that is obtained by the SEM, so that a shift vector between a center coordinate of the design data template and an image including an actual AP is detected. Next, the processing control unit 215 causes beam shift (change an irradiation position while tilting an incident direction of beam) by controlling the deflector 206 through the deflection control unit 220 by a difference obtained by subtracting the above-described detected shift vector from a relative vector between the coordinates of the design data template and the coordinates of an EP to obtain an image of the EP while moving the imaging position. Generally, positioning can be performed highly accurately because positioning accuracy of beam shift is higher than positioning accuracy of a stage. As described above, the positioning can be performed highly accurately independently of the positioning accuracy, etc. of a stage by providing an AP.

After that, on the basis of the control and processing of the processing control unit 215, an imaging position is moved to an FP by beam shift, the FP is imaged, a parameter of auto-focus is obtained, and auto-focus correction is performed on the basis of the obtained parameter (step 2004).

After that, on the basis of the control and processing of the processing control unit 215, the imaging position is moved to an SP by beam shift, the SP is imaged, a parameter of astigmatism correction is obtained, and auto astigmatism correction (auto-stigma correction) is performed on the basis of the obtained parameter (step 2005).

After that, on the basis of the control and processing of the processing control unit 215, the imaging position is moved to a BP by beam shift, the BP is imaged, a parameter of brightness and contrast correction is obtained, and auto-brightness and contrast correction is performed on the basis of the obtained parameter (step 2006).

It is noted that the addressing, the auto-focus, the auto-stigma, the auto-brightness and contrast in the above-described steps 2003, 2004, 2005, and 2006 may be omitted partially or wholly in some cases. The order of steps 2003, 2004, 2005, and 2006 may be changed, and the coordinates may overlap (for example, the auto-focus and the auto-stigma are performed at an identical location).

In the end, on the basis of the control and processing of the processing control unit 215, the imaging position is moved to an EP by beam shift, the EP is imaged, matching of a design data template in the EP that is registered with the storage device 223 and an SEM image of the observed EP is performed, and a shift amount of an examination point in the SEM image is calculated (step 2007). The measurement is performed on the examination point of the design data, which is given by an imaging recipe.

Figure 6:
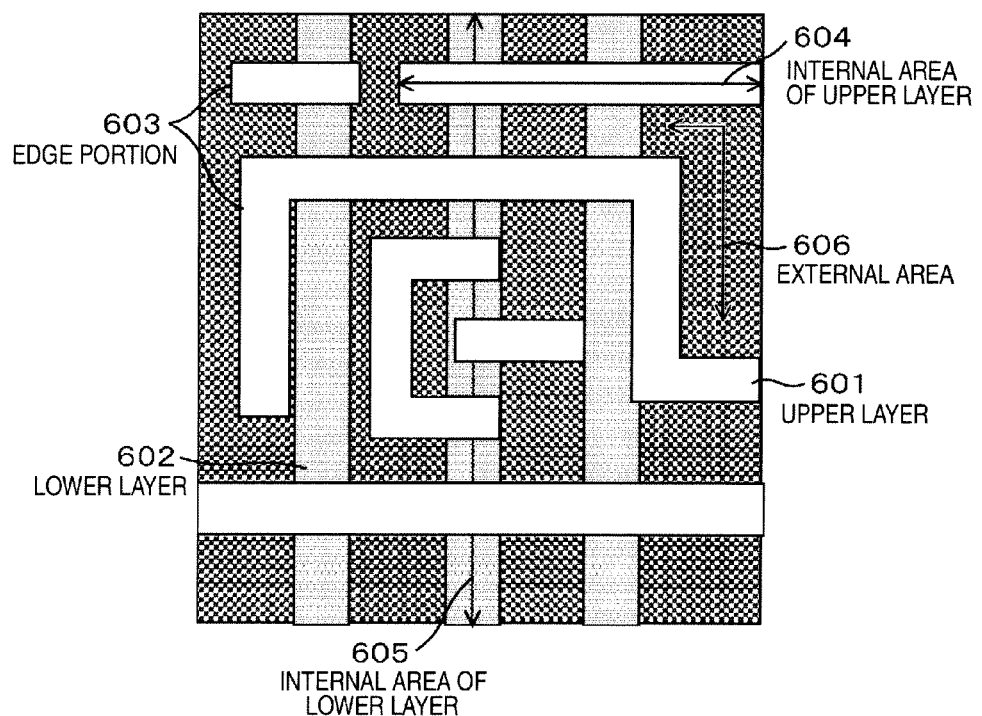
FIG. 6 is a diagram illustrating an example of design data.

An example of design data is described below. FIG. 6 is an image diagram of design data. Generally, design data is designed by an EDA tool and includes vector information, image information, text information, or combined information of the pieces of information.

A circuit diagram of a semiconductor device is described in design data. Pieces of information that correspond to one circuit portion on the semiconductor are collectively referred to as one line. The design data includes circuit information of at least one line or more. The circuit diagram described in the design data may have a multi-layer structure, and each layer is referred to as a layer herein. When the design data has a format by which a layer is discriminated, a top layer is referred to as an upper layer 601, and a layer that is described under the upper layer is referred to as a lower layer 602. Each of the layers includes information of a circuit edge 603 and internal/external area information that indicates whether the layer is in the internal area (604 and 605) of a closed figure shape or in the external area 606 of the closed figure shape.

In an embodiment that is described below, a matching method is described of setting a matching area on the basis of information related to a closed figure shape or an area that is segmented by line segments that form a pattern. The above-described segment area is described later, and internal/external area information and area information may be the same information. The internal/external area information can be represented by a drawing direction of a closed figure shape when the information is vector data, and can be represented by brightness, etc. of a cell when the information is image data. Specifications of the design data are different depending on a design method, and the specification is not always in accordance with the characteristic of the layout that is illustrated in FIG. 6.

In addition, there may be design data having two layers or more. The embodiment that is described below is valid regardless of a format of design data. In addition, mask data with optical proximity correction (OPC) and process data required for a manufacturing process can be treated as design data.

Figure 7:
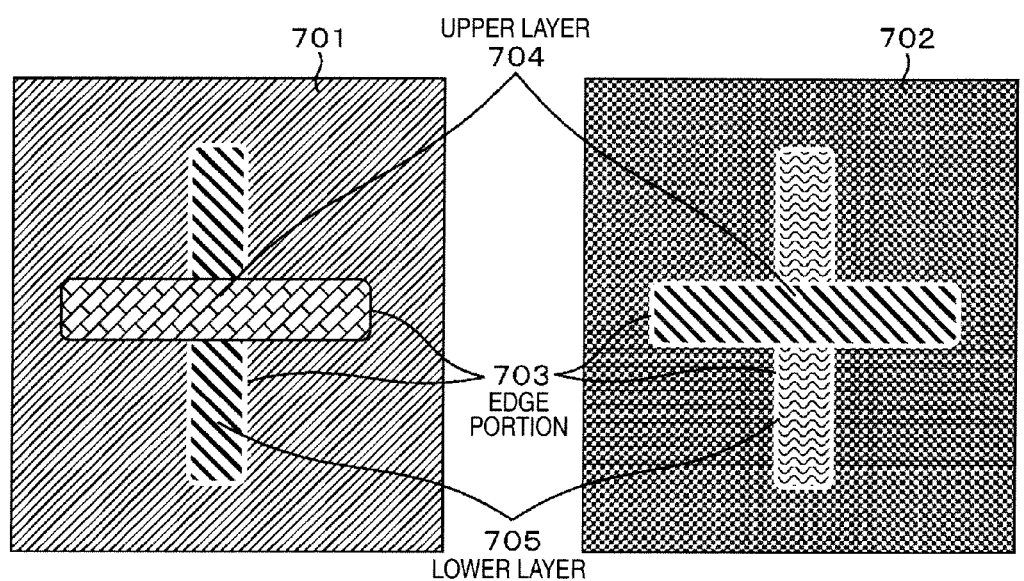
FIG. 7 is a schematic diagram illustrating an SEM image.

FIG. 7 illustrates a schematic diagram of a characteristic of an image of a circuit pattern, which is captured using an SEM (hereinafter, referred to as SEM image). In a case of comparing the right and left diagrams in FIG. 7, brightness may vary depending on various factors such as change of a process condition and change of an optical condition of an electron microscope even when the SEM images has the same pattern. For example, between a portion 701 and a portion 702 that are background portions for a pattern, the contrasts are reversed even when the portions are located in the same position.

Generally, an edge portion 703 of an SEM image has high brightness due to the influence of an edge effect. Generally, the portion is called a white band. The length and the width of a white band formed on the basis of a principle as described above are different depending on design data and quality. On the other hand, in an area other than the white band, an area that is surrounded by the white band or an external area other than the white band is affected by noise, however, the areas have a characteristic in which brightness change in the areas becomes small (flat). More specifically, brightness change in the internal or external area of a pattern is relatively small as compared to an area including different plurality of members, or an area including an edge portion.

In addition, in an SEM image, two or more layers may be displayed. On the SEM image that illustrated in FIG. 7, a pattern in the upper most layer (pattern that is not covered by another pattern on the SEM image) is referred to as an upper layer 704.

Generally, a pattern that is partially overlapped with a pattern of the upper layer 704 and arranged on a lower layer of the upper layer 704 (lower layer 705) is not displayed on the SEM image.

Generally, a recent semiconductor device has a multi-layer structure, and a pattern may further exist under the pattern of the lower layer (lower layer 705). As described above, even when lower layer patterns overlap each other, a part of the pattern on the lower layer side is not displayed on the SEM image.

Three areas of an internal area of a pattern (hereinafter, referred to as a pattern internal area), an external area of the pattern (hereinafter, referred to as a pattern external area), and an edge portion that can be identified by associating an SEM image with design data have different characteristic quantities of images, and in the first embodiment, a method is described of performing pattern matching on the basis of a difference of the characteristic quantities between the two or more areas. It is noted that, a matching method for a pattern that is mainly constituted by two layers of an upper layer pattern an a lower layer pattern is described below, and the matching method can be applied to the first embodiment as long as there is a pattern having a single layer (one layer) or more.

Figure 8:
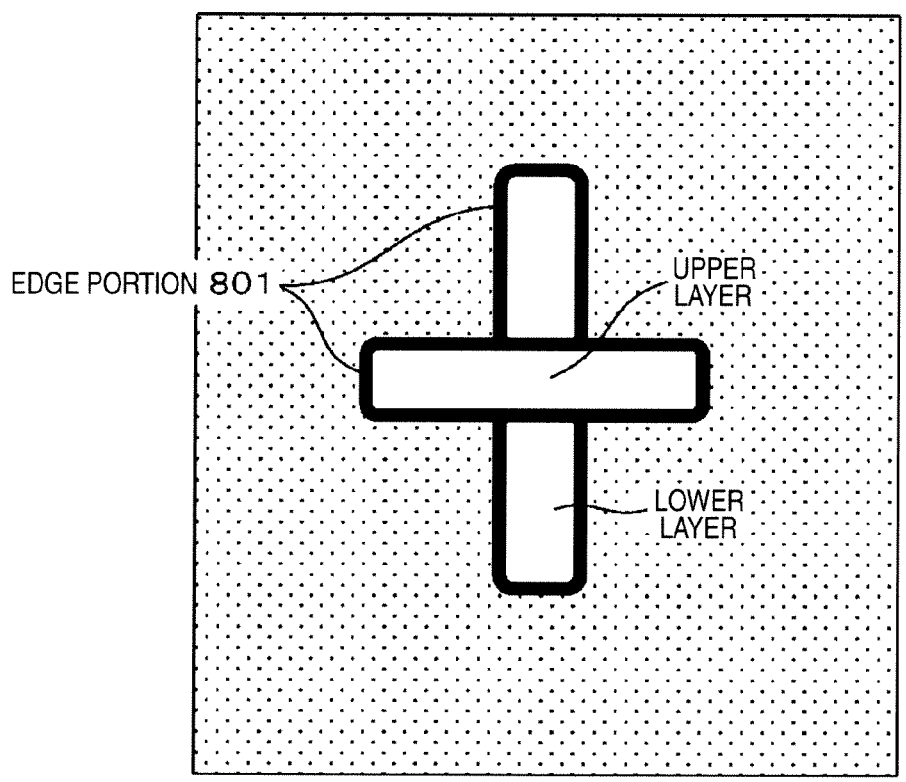
FIG. 8 is a diagram illustrating a creation example of a template.

As described above, in an SEM image, contrasts may be reversed due to various factors. Therefore, a matching method with respect to brightness information and contrast is difficult to be applied. Thus, it is conceivable that, by performing processing to make an edge portion 801 wider, a design data template (hereinafter, referred to as a template) is created from the design data that illustrated in FIG. 8, and the template is regarded as a template for matching with an SEM image having a white band. A gap of characteristic quantities of the SEM image and the design data can be suppressed by performing the above-described processing because a white band has a certain amount of width.

Figure 9:
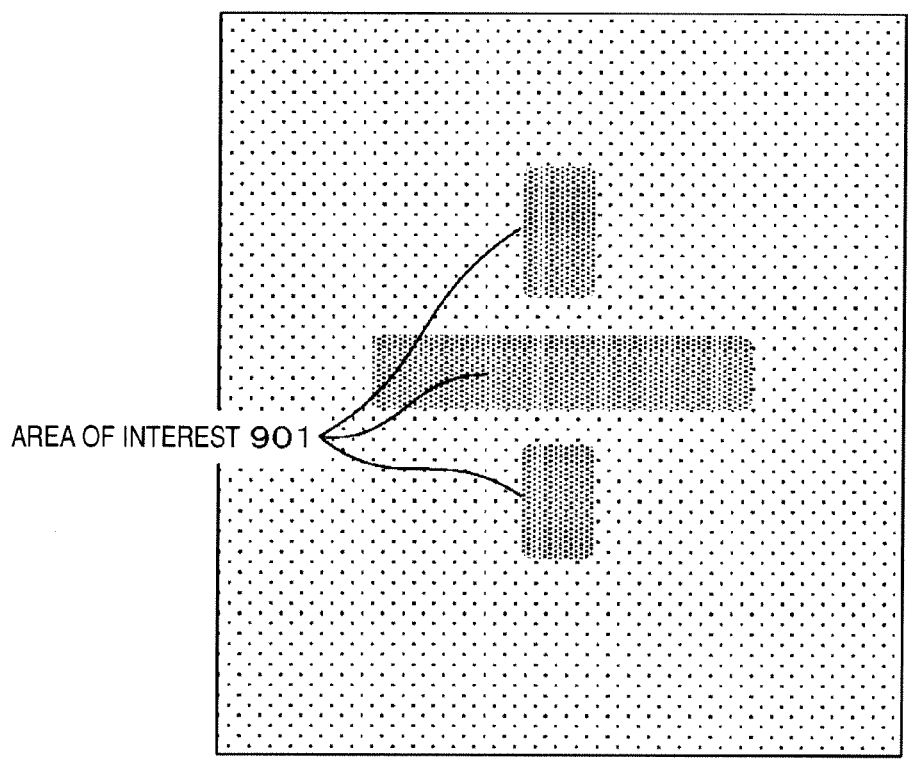
FIG. 9 is a diagram illustrating an example in which an area of interest is extracted from the template.

A specific example of a method of performing matching on the basis of internal area information and/or external area information of a pattern is described below. In this example, as illustrated in FIG. 9, first, processing is performed that removes an area that corresponds to an edge portion from design data, extracts an internal area of a pattern. The extracted area is referred to as an area of interest 901. In addition, here, a portion that corresponds to the internal area of the pattern on the design data is defined as an internal area, and a portion that corresponds to the external area of the pattern is defined as an external area. An area of interest can be extracted from the design data using manual or automatic analysis. It is noted that the area of interest is a line or plane that is described on an image, and the shape is varied by a parameter as an index for performing the pattern matching.

Figure 10:
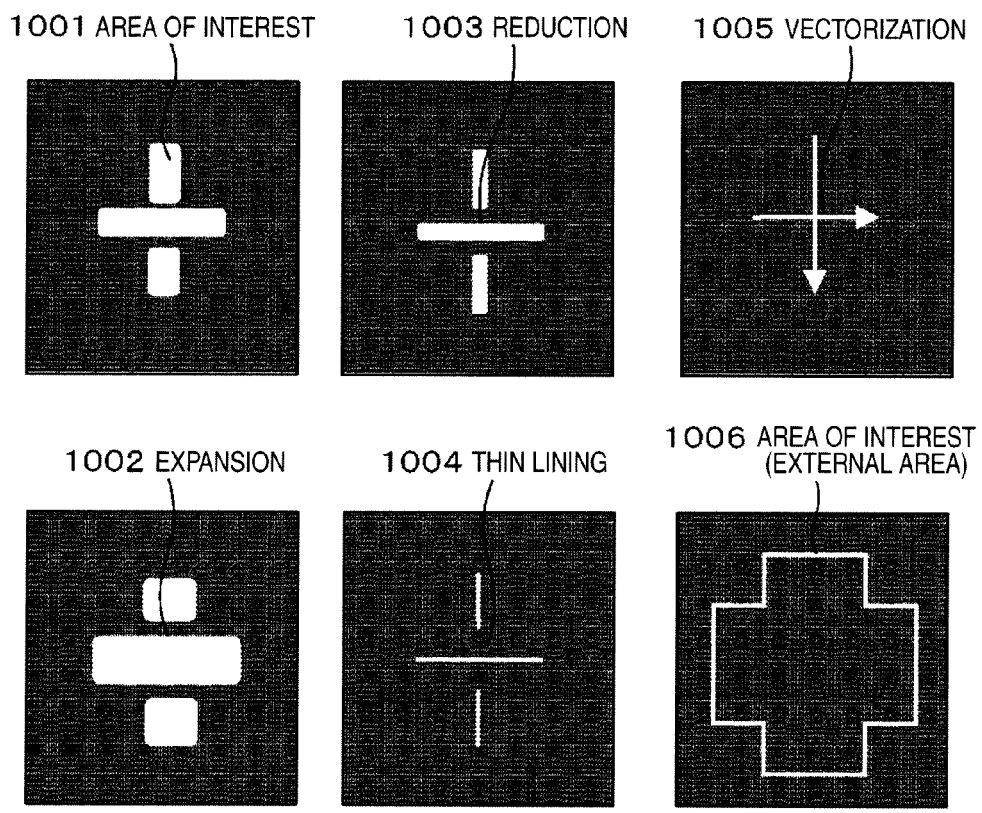
FIG. 10 is a diagram illustrating of a modification example of the area of interest.

For example, as illustrated in FIG. 10, it is conceivable that, for the obtained area of interest, an expanded pattern 1002 is formed by performing expansion processing for the obtained area of interest, a reduced pattern 1003 is formed by performing reduction processing, a thin line 1004 is formed by performing thinning processing, and vector data 1005 is formed by vectorization processing. The areas can also be defined as an area of interest. In addition, an external area of interest 1006 may also be formed by performing the above-described processing on the external area of the pattern. Hereinafter, when internal/external area information is obtained, all of them are obtained from an area of interest unless otherwise indicated.

An area of interest can be extracted for each pattern that is included in a circuit that is described in design data, so that a plurality of areas of interest can be extracted. A method of obtaining an area of interest is not limited to the above-described example. In addition, the area of interest that is illustrated in FIGS. 9 and 10 includes a pattern having a multi-layer, and an area of interest of the lower layer is partially covered by the upper layer. Focused areas of the upper layer and the lower layer can be obtained independently. In this case, a shape except for an edge portion of the upper layer on the area of interest of the lower layer and the internal area is obtained.

Figure 11:
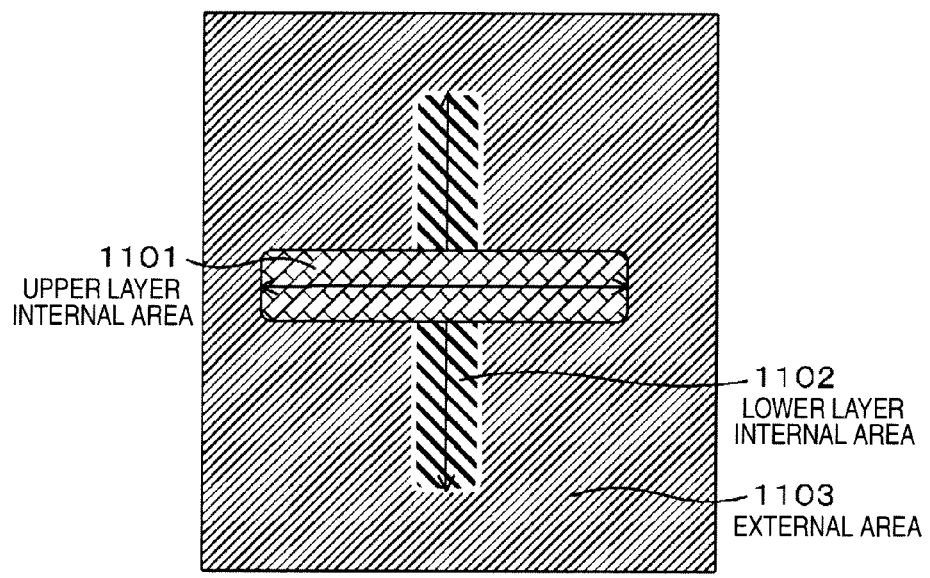
FIG. 11 is a diagram illustrating internal and external areas of the SEM image.

Next, the general description of an SEM image that corresponds to design data from which the above-described area of interest is extracted is made. FIG. 11 illustrates internal and external areas of a pattern in an SEM image. The definition of an upper layer internal area 1101, a lower layer internal area 1102, and an external area 1103 respectively correspond to the internal area of an upper layer 604, the internal area of a lower layer 605, and the external area 606 of corresponding design data. The definition varies depending on the way to give design data.

The above-described step of obtaining information of an area of interest is included in the design data analysis and template creation 101. However, the execution order is not limited, and any step may be executed before and after the design data analysis and template creation.

In the method that is described in the first embodiment, for the above-described area of interest, an index value of the area is selectively obtained, and a matching position is identified on the basis of the index value. As an aspect, a matching position is identified on the basis of determination whether or not an index value unique to one area of interest satisfies a certain condition. For example, at the time of matching, a template and an SEM image are overlapped, and at least one piece of information such as brightness of each pixel and peripheral slope in an area of interest is obtained. The obtained information is set as brightness, as an example. For the obtained brightness information, one or more parameters that are parameters as an index (hereinafter, referred to as index values) such as a maximum value, a minimum value, an average value, a standard deviation, variance, a differential value around a pixel, the number of brightness peaks, and a brightness waveform of the area of interest are calculated. The matching is performed on the basis of the calculation result. The first embodiment is described below using the maximum value, the minimum value, the average value, the standard deviation, the variance, etc. as a statistical quantity, and using the number of brightness peaks, the brightness waveform, etc. as an analysis result. It is noted that it is desirable that the index value is optionally selected in accordance with a characteristic of an area of interest. In addition, a parameter that is included in a statistical quantity and a profile is not limited to the above-described example.

The above-described step of obtaining at least one piece of information such as brightness of each pixel and peripheral slope in an area of interest is included in the internal/external area information analysis 102 using design data. However, the execution order is limited as long as the step 101 is executed before the internal/external area information analysis 102.

The general description of the template matching using a characteristic quantity of an area of interest is made below.

Figure 12:
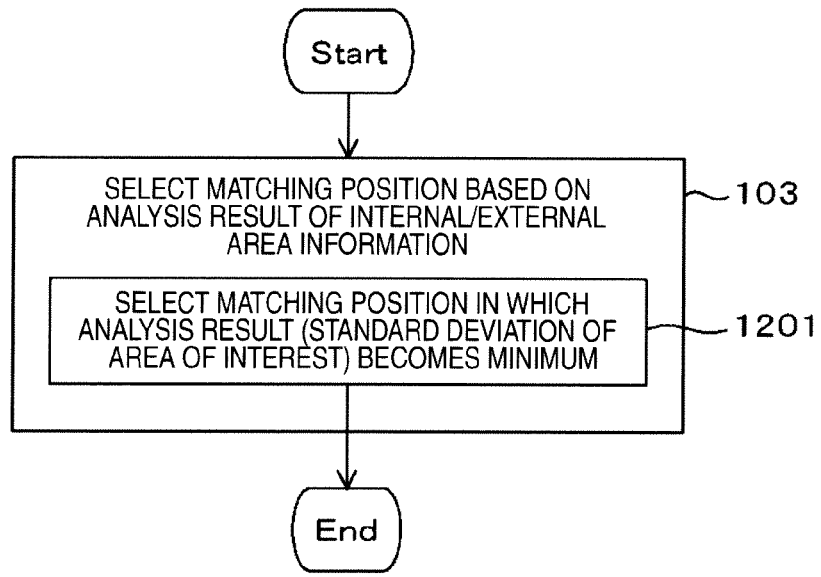
FIG. 12 is a flowchart illustrating an example of a selection process of a matching position.

As illustrated in FIG. 1, a series of procedures from the template creation to the matching using the created template in the first embodiment includes a step of creating a template and an area of interest from design data (step 101), a step of obtaining and analyzing brightness of an SEM image that is overlapped with an area of interest in an optional position (analysis step of internal area information: step 102), and then a step of selecting a matching position on the basis of the analysis result of the internal area information (step 103), and in the step 103, the following processing is performed specifically. FIG. 12 is a flowchart illustrating an example of a selection process (step 103) of a matching position.

In step 1201, a matching position is identified by selecting a position in which the analysis result (for example, a standard deviation of a brightness value in an area of interest) becomes the smallest. In this step, for example, a standard deviation of brightness in the area of interest is calculated. For example, it is assumed that the standard deviation is an index value I. A threshold value is set to zero because change of brightness has a tendency to be close to flat in the area of interest. A matching position in which the index value I is closest to the threshold value is obtained, and is set to a correct matching position. The threshold value is an optionally given value, the index value I is not limited to the standard deviation. In addition, a process to perform filtering on an SEM image and make the influence of the noise small enough etc. may be included in step 1201 in order to remove the influence due to noise.

Through the process as illustrated in FIG. 12, accurate matching can be performed in accordance with a characteristic quantity of the internal or external area of a pattern. In a case in which, for an area of interest, analysis of a searched area on an SEM image is performed by a template having information on the index value I as described above, for example, when both of a line segment of a pattern edge and a lower layer, and the internal area of the pattern are included in the area of interest, brightness varies in the area of interest because the edge portion, etc. has a higher brightness than that of the internal area of the pattern. On the other hand, when the area of interest coincides with the internal area of the pattern, as described above, change of brightness is small in the internal area of the pattern, so that a standard deviation becomes a value close to zero. As described above, by performing analysis using a characteristic of the internal area of the pattern, differentiation from a position having a characteristic other than the characteristic of the internal area can be performed highly accurately. In this example, when an edge, etc. of a pattern is mixed in addition to the matching position and a unique portion in shape does not exist, a success rate of the matching can be increased.

Figure 13:
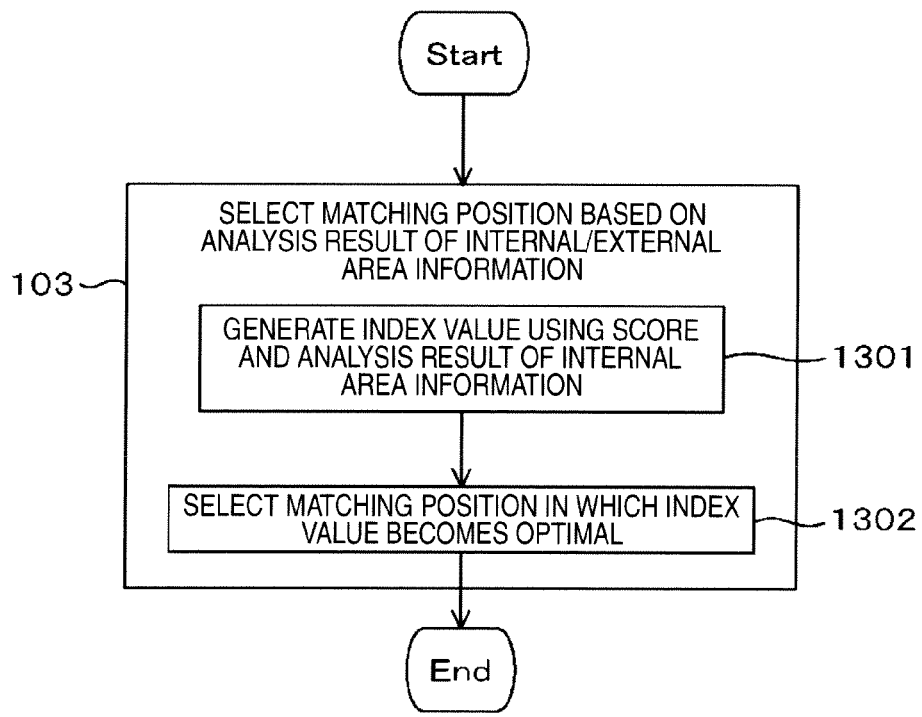
FIG. 13 is a flowchart illustrating an example of a selection process (step 103) of a matching position.

FIG. 13 is a flowchart illustrating another example of the selection process (step 103) of a matching position. In this example, a matching position is selected using both a matching score and an analysis result of internal area information. To be specific, the step includes a step of generating an index value I using a score F in each matching position that is obtained by performing image correlation calculation and a statistical quantity in an analysis result of internal area information of an area of interest (step 1301) and a step of selecting a matching position in which the index value I becomes optimal (step 1302). A calculation example of the index value I in step 1301 is described below. In this example, the above-described statistical quantity is referred to as a standard deviation S. As previously described, a portion other than an edge portion of an SEM image has a characteristic in which the brightness change becomes flat when noise is removed. When matching based on the correlation value calculation is successfully performed, an ideal value of the standard deviation S is zero. On the contrary, when the matching is not successfully performed, a portion in which the brightness is not flat (internal and external area of another layer or edge portion) is included in the area of interest, so that variation in brightness occurs, and the standard deviation S is increased. Therefore, a value obtained by dividing a score F by a standard deviation S is regarded as an index value I (=F/S).

At this time, a matching position in which the index value I becomes maximum is regarded as a correct matching position. Such a calculation method of an index value I is not limited to the above-described calculation expression.

Figure 14:
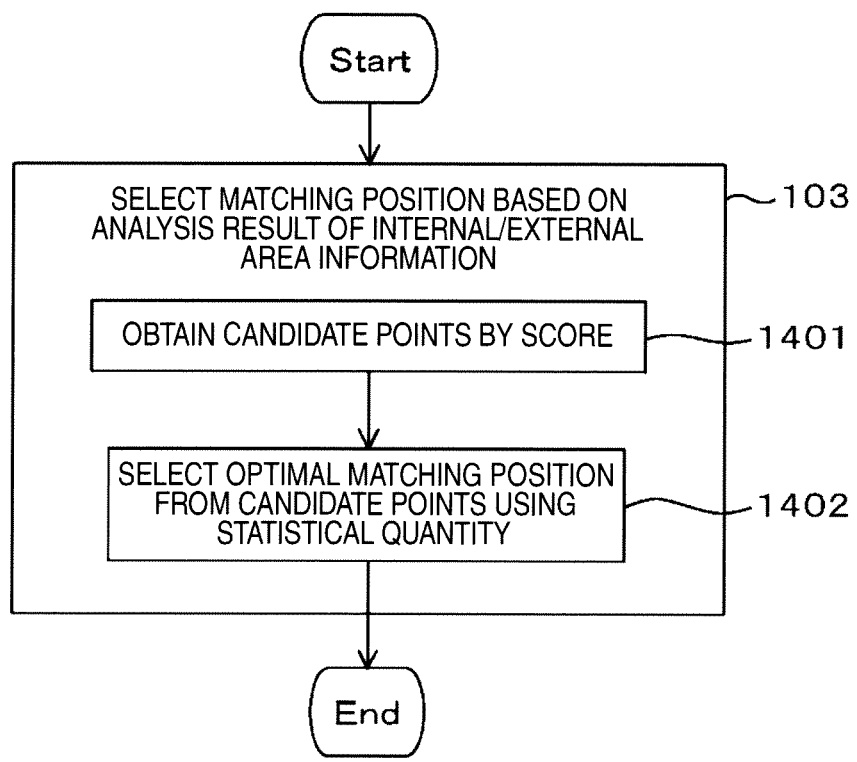
FIG. 14 is a flowchart illustrating an example of the selection process (step 103) of a matching position.

FIG. 14 is a flowchart illustrating another example of the selection process (step 103) of a matching position. In this example, a candidate point is selected by determination using a matching score, and an optimal matching position is selected for the candidate point using a statistical quantity, etc. This example includes a step of obtaining one or more candidate points in which an optional threshold value is satisfied in order of a matching position having a higher score F using normalization correlation (step 1401) after the image correlation calculation, and a step of selecting an optimal matching position from a statistical quantity that is obtained as internal/external area information, for the obtained one or more candidate points (step 1402).

It is conceivable that in the above-described threshold value, 80% of the maximum score is regarded, for example, as a score F. That is, a portion having a score of a specific value or more is defined as a candidate point. When 80% of the maximum score is regarded as a threshold value, a matching position M in which M≥0.8 F is satisfied is regarded as a candidate point. By determining an area of interest using a statistical quantity for the candidate point extracted as described above, a final matching position is filtered. In this example, the statistical quantity is regarded as a standard deviation S in brightness. For the candidate points, on the basis of assumption that brightness change in the area of interest is flat, standard deviations in brightness are compared, and a candidate in which the standard deviation becomes minimum is regarded as a matching position.

It is noted that, even in this example, the above-described threshold value is determined optionally, and a selection method of a candidate point is not limited to the condition under which the above-described score is 80% or more. In addition, a standard deviation in brightness is one common example of the statistical quantity, and the statistical quantity is not limited to the standard deviation. In addition, a clustering method is not limited to the above-described example. For example, a known clustering method such as a k-means method and a minimum distance method may be employed for the clustering method. In addition, a clustering method of relatively comparing characteristic quantities included in candidate points may be employed for the clustering method.

According to the matching method that is illustrated in FIGS. 13 and 14, matching can be performed with higher accuracy by combining a first matching method by image correlation, etc. and a second matching method based on the above-described determination of a characteristic quantity in an area of interest. In particular, each of the matching candidates can be filtered by the other matching method, which is effective for suppression of matching error.

In addition, an example in which a matching candidate is selected on the basis of clustering of matching candidates in step 1402 is described with reference to the flowchart of FIG. 15. The flowchart of FIG. 15 includes a step of determining whether or not clustering of matching candidates is required (step 1501), a step of selecting a clustering method from a statistical quantity when the clustering is performed (step 1502), a step of performing the clustering using the statistical quantity (step 1503), a step of selecting an optimal class on the basis of the clustering result (step 1504), a step of selecting whether or not to perform further clustering in the optimal class (step 1505), and a step of selecting a matching position from the class (step 1506).

Step 1501 is, for example, a step of determining that clustering is not required when all candidate points are within ±10% from an average value of the statistical quantities. The step is a step of determining whether or not a matching position should be obtained by clustering of candidate points when the clustering is not performed well due to the influence of noise, etc. because variation in the statistical quantities is small. The determination method in step 1501 may be optionally set. In addition, automatic setting may be performed on the basis of statistical quantities, etc.

Step 1502 is a step of determining a statistical quantity using as an index and a clustering method. For example, the step is a step of selecting one method from a method of performing clustering by an average value of the standard deviations when an index value is regarded as a standard deviation, and a method of performing clustering depending on whether the maximum value or the minimum value is closer to a standard deviation. The step is a step of selecting that clustering is performed depending on whether the maximum value or the minimum value is closer to a standard deviation if it can be determined that the maximum value is determined to be far enough from the minimum value in the step 1501. In addition, the step is a step of selecting a clustering method in accordance with a statistical quantity to be used.

Step 1503 is a step of, for example, performing clustering of candidate points into two depending on whether the maximum value or the minimum value is closer to a standard deviation. Step 1504 is a step of, for example, regarding a candidate point class that is close to the minimum value as an optimal class that is a correct candidate on the basis of the result obtained in step 1504 using a characteristic in which the standard deviation becomes smaller when an area of interest is regarded to be in the internal area of an upper layer.

Step 1505 is a step of selecting whether or not to perform clustering again. For example, a standard deviation is checked in a candidate point class that is close to the minimum value, and clustering is performed again if a difference between the maximum value and the minimum value of the standard deviation in the class is greater than an optional value. Clustering is not performed again if a difference between the maximum value and the minimum value is smaller than the given value. The step is a step of determining which of the two pieces of processing is performed. Step 1506 is a step of, for example, regarding a candidate having the maximum score in a class as a matching position. Any clustering method, any clustering execution determination method, and any index value may be employed for the steps.

Figure 15:
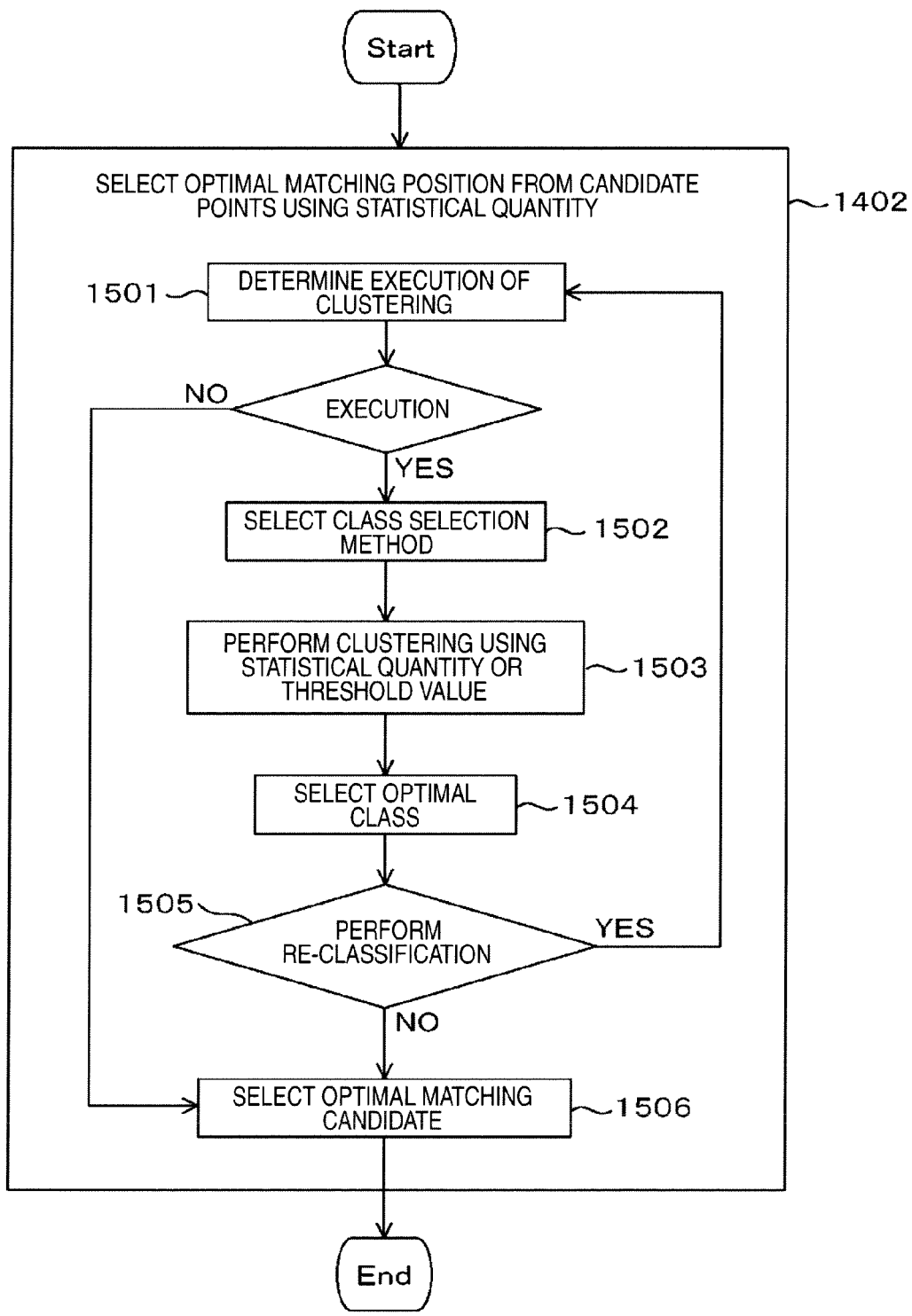
FIG. 15 is a flowchart illustrating an example in which a matching candidate is selected on the basis of clustering of matching candidates.
Figure 21:
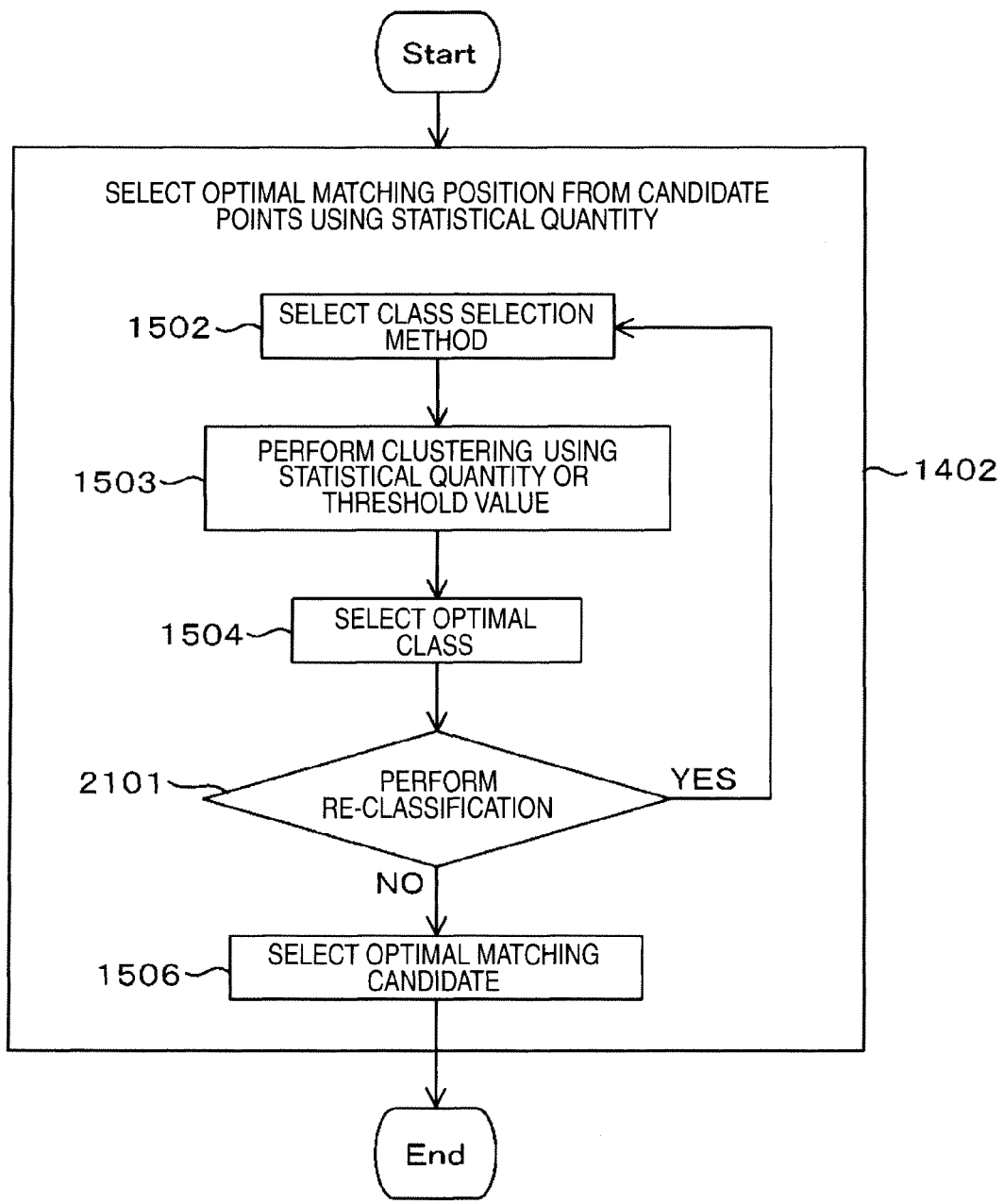
FIG. 21 is a flowchart illustrating another example in which a matching candidate is selected on the basis of clustering of matching candidates.

FIG. 21 is a flowchart illustrating a process to select an optimal matching position from candidate points using a statistical quantity without performing clustering execution determination step (step 1501) in FIG. 15.

The flowchart that is illustrated in FIG. 21 includes step 2101 of determining whether or not to perform re-classification. In step 2101, execution determination of re-classification is performed. For example, the step is a step of determining how many steps is the current step in performing the steps from step 1502 to step 2101 "n" times. Here, a value of "n" ranges from 0 to the number of candidate points, and a matching candidate before clustering is performed is output to the step 1506 when "n=0". The number of times "n" by which re-clustering is performed may manually be specified or may be automatically calculated from some kind of characteristic of a candidate point group.

In addition, in the execution determination of re-classification in step 2101, validity of a clustering result may be determined. For example, mutual or absolute comparison of a class before classification is performed and a class group of classes after the classification is performed using statistical quantity reference, information quantity reference, histogram, a threshold value, etc. For example, as the determination method of validity of the clustering result, a bayesian information criterion that is a known technology is used. If the classification is valid, re-classification of an optimal class is performed. If the classification is not valid, the class before the classification is performed is output to step 1506. The execution determination method of re-classification may be performed using other than the above-described statistical quantity reference, information quantity reference, histogram, a threshold value, etc.

The pattern matching method that is described in detail can be employed for an electron microscope and an image processing device that include the image processing function illustrated in FIG. 2 as a computer program that causes a dedicated image processor or a general-purpose calculation processor to operate, and matching of a template and an SEM image can be performed at a high speed by selectively using internal/external area information of a pattern (for example, the internal area of an upper layer 604, the internal area of a lower layer 605, and the external area 606). In addition, a matching success rate can be improved by combining with image correlation calculation. In addition, information that is required for the matching can be obtained from design data and the SEM image, so that the burden of a user can be reduced.

Second Embodiment

Figure 16:
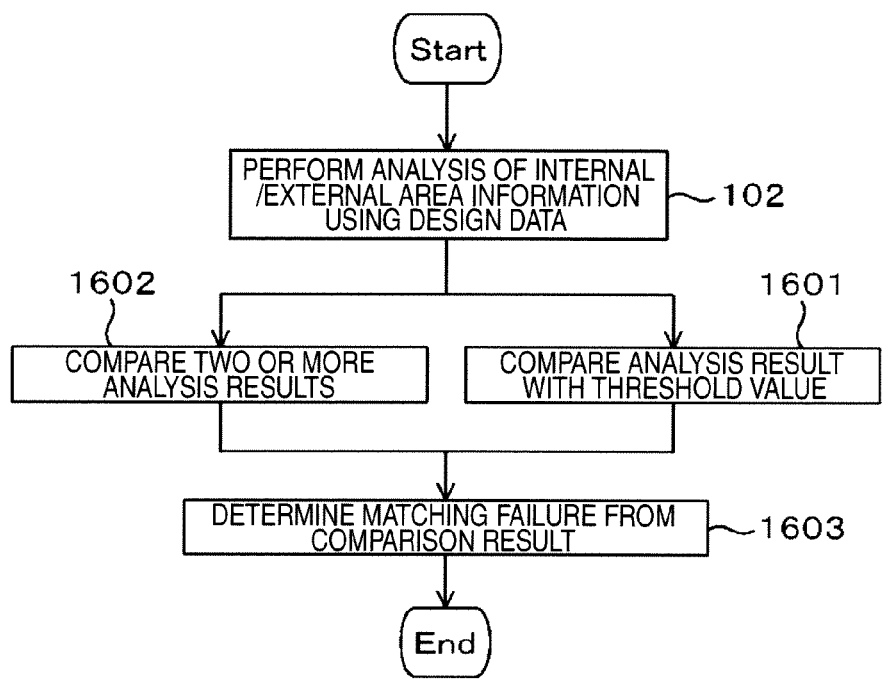
FIG. 16 is a flowchart illustrating an example of a determination method of matching error.

In addition, the above-described characteristic quantity determination method of an area of interest can be used as a determination method of matching error. FIG. 16 is a flowchart illustrating an example of the determination method of matching error, and after executing the step 102 that is illustrated in FIG. 1, a step of comparing an analysis result with a threshold value (step 1601) or a step of comparing two or more analysis results (step 1602), and a step of determining matching failure on the basis of the comparison result (step 1603) are executed.

The steps 1601, 1602, and 1603 are described in detail. The analysis result that is obtained in the step 102 is given by a statistical quantity, and here, the analysis result is regarded as a standard deviation S. When matching is successfully performed, an ideal value of the standard deviation S is zero. In the step 1601, a standard deviation S and an optionally given threshold value are compared. Here, when the standard deviation S is greater than the threshold value, matching failure is determined in the step 1603. In the step 1602, the sizes of two or more standard deviations S1 and S2 are obtained. The greater size at this time is determined as matching failure in the step 1603. Each of the above-described parameters can be set as an optional value.

The determination method of matching error as described above can be employed for an electron microscope and an image processing device that include the image processing function as illustrated in FIG. 2, and matching failure can be determined by using internal/external area information of a pattern (for example, the internal area of an upper layer 604, the internal area of a lower layer 605, and the external area 606). As a result, when pattern matching is performed, processing at a high speed can be performed because execution of matching processing in an erroneous position can be avoided. In addition, a matching success rate can be improved because the erroneous position is removed beforehand. In addition, images to be determined when the user determines a correct matching position can be reduced, so that the burden of the user can be reduced.

Third Embodiment

Figure 17:
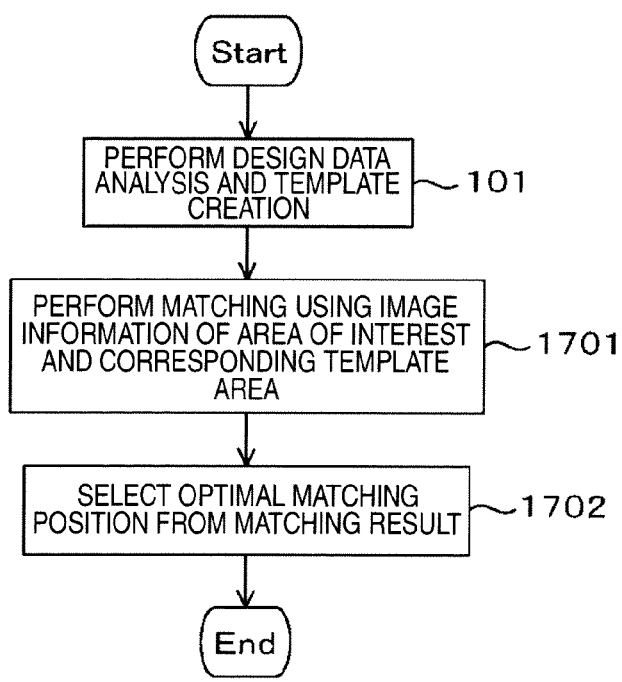
FIG. 17 is a flowchart illustrating a pattern matching method selectively using an area of interest.

In addition, as the pattern matching method, pattern matching using only an area of interest can be performed. FIG. 17 is a flowchart illustrating an example of a matching method selectively using an area of interest, and after executing step 101 that is illustrated in FIG. 1, a step of performing matching using an optional image area that corresponds to the area of interest and an area on a template that corresponds to the area of interest (step 1701), and a step of selecting an optimal matching position on the basis of the matching result (step 1702) are executed.

Figure 18:
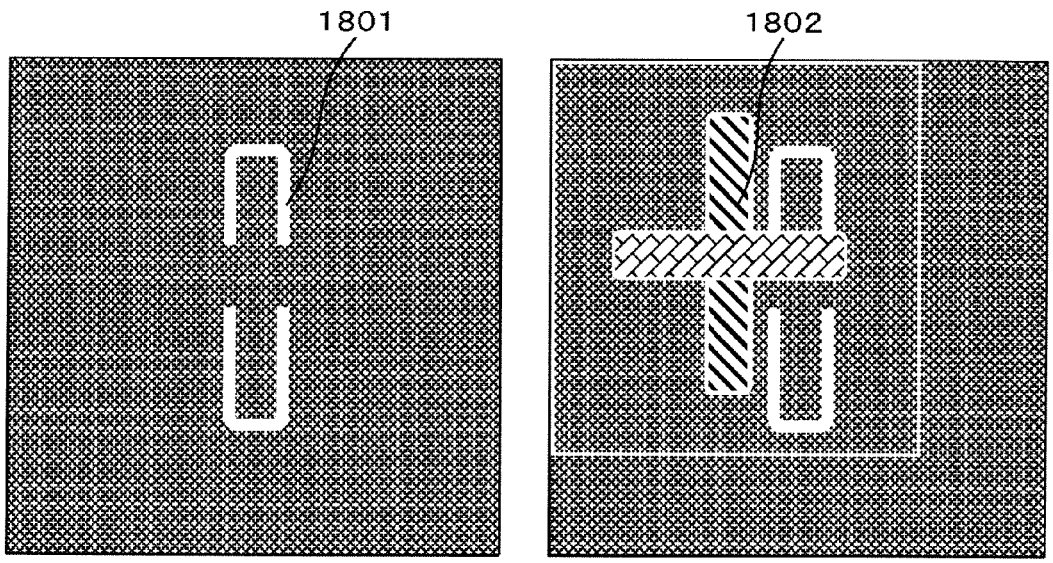
FIG. 18 is a schematic diagram illustrating matching using a difference template.

Steps 1701 and 1702 are described in detail. FIG. 18 is a diagram illustrating a specific example of a matching method using a template that selectively uses an area of interest. Here, it is assumed that an SEM image and design data has a multi-layer structure, and the area of interest is in the external area of an upper layer. In step 1701, matching is performed using a lower layer template 1801 in which an area of interest of a template (upper layer part) is masked (hereinafter, referred to as a difference template). The left diagram of FIG. 18 is a diagram illustrating an example of a difference template, and the right diagram is a diagram illustrating an execution example of matching using a difference template on an SEM image 1802. When such matching is performed, the methods according to the embodiments that are described above can be applied to the matching. In addition, in the above-described methods, an area of interest can have any of a single layer and a multi-layer.

As described above, the above-described pattern matching method can be applied to an electron microscope and an image processing device that include the image processing function as illustrated in FIG. 2, and matching of a template and an SEM image can be performed at a high speed by selectively using internal/external area information of a pattern (for example, the internal area of an upper layer 604, the internal area of a lower layer 605, and the external area 606). In addition, information that is required for the matching can be obtained from design data and the SEM image, so that the burden of the user can be reduced.

Fourth Embodiment

Figure 19:
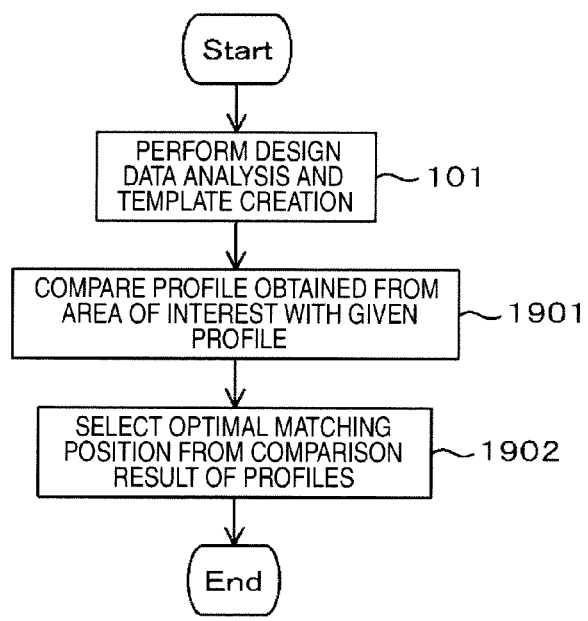
FIG. 19 is a flowchart illustrating a matching method using a profile.

In addition, as the pattern matching method, pattern matching based on a profile can be performed. FIG. 19 is a flowchart illustrating an example of a matching method using profile information of an area of interest, and after executing step 101 that is illustrated in FIG. 1, a step of comparing a profile that is obtained from an area of interest in an optional position with an optional profile using a profile as an index (step 1901), and a step of selecting an optimal matching position on the basis of the comparison result of the profiles (step 1902) are executed. Here, the profile is an ideal profile in an area of interest that is set by the user and a profile based on a template.

In the step 1901, for example, a profile that is obtained from an area of interest is subject to a differential filter, and the number of peaks that is higher than an average value of brightness is detected. The detected number of peaks and the number of peaks of a profile based on a template are compared. In addition, processing to perform normalization correlation using a profile that is obtained from the template for the profile that has been subject to the differential filter, etc. can also be performed.

In the step 1902, an optimal matching position is selected on the basis of the above-described comparison result. Clustering due to match or mismatch of the number of peaks by the above-described comparison, clustering by comparison between peaks, etc. may be performed. A candidate point the peak shape of which is the closest to an ideal value or a candidate point has the maximum score of image correlation after clustering is performed is selected as the best matching candidate, on the basis of the above-described comparison result. In addition, a parameter such as the number of peaks which can be replaced with a statistical quantity of the execution example can be adapted to the execution example.

As described above, the above-described pattern matching method is applied to an electron microscope and an image processing device that include the image processing function as illustrated in FIG. 2, and matching of a template and the SEM image can be performed at a high speed by selectively using internal/external area information of a pattern (for example, internal area of an upper layer 604, internal area of a lower layer 605, and external area 606). In addition, by using a profile of a template, etc. pattern matching can be performed for an area of interest to which another layer is reflected in a multi-layer image, thereby improving a matching success rate. In addition, the information that is required for the matching can be obtained from design data and the SEM image, thereby reducing the burden of the user.

It is conceivable that the above-described embodiments are employed for an image processing device. For example, the above-described embodiments can be executed in an image processing device that is mounted on a critical dimension-SEM (CD-SEM), a personal computer that executes a program for pattern matching, etc. In addition, a user interface that performs setting for selectively executing a function to optionally set execution or non-execution of the processing of the above-described embodiments by a user or a part of the function may be provided in the devices.

The above-described pattern matching method can be employed for an electron microscope and an image processing device that include the image processing function as illustrated in FIG. 2, and the embodiments of which can be changed in accordance with a condition that is desired by the user, so that a processing time and a success rate can be suited for the needs of the user.

It is noted that, in the above-described embodiments, an SEM is used in order to obtain an image of a semiconductor device but alternatively, the above-described methods may be applied to pattern matching using an image that is obtained by an imaging device other than an SEM. For example, similar operation and effect can be obtained also when a device that obtains an image of the semiconductor device using an optical imaging means is used, however, the higher effect can be obtained by applying the pattern matching method to a charged particle beam device such as a scanning electron microscope by which an image that has more noise than that of an optical microscope, etc. is formed.

Reference Signs List
201 Semiconductor wafer
202 Electron optical system
203 Electron gun
204 Primary electron
205 Extraction electrode206
206 Deflector
207 ExB deflector
208 Objective lens
209 Secondary electron detector
210 and 211 Reflection electron detector
212 to 214 A/D converter
215 Processing control unit
216 Display, computer
217 XY stage
219 Stage controller
220 Deflection control unit
221 Focus control unit
223 Storage device
225 Imaging recipe creation unit
230 Design system
251 CPU
252 Image memory
253 LSI

The invention claimed is:

1. An image processing device comprising a calculation unit that performs pattern matching on an image using a template that is formed based on design data, wherein the calculation unit is configured to:
perform the pattern matching of the template based on an image of a semiconductor including a plurality of layers and the design data for the plurality of layers corresponding to the semiconductor including the plurality of layers in the image,
obtain a characteristic quantity of the image in an area of interest by removing an area corresponding to an edge portion for an internal area and/or an external area that is segmented by a line segment that defines a contour of a pattern of the design data, and
determine a position in which the characteristic quantity satisfies a certain condition as a matching position, a matching position candidate, or an erroneous matching position.

2. The image processing device according to claim 1, wherein the calculation unit determines a position in which variation in brightness of the internal area and/or the external area satisfies a certain condition as a matching position, a matching position candidate, or an erroneous matching position.

3. The image processing device according to claim 2, wherein the calculation unit determines the matching position, the matching position candidate, or the erroneous matching position based on comparison of a parameter that indicates the variation in brightness and a certain threshold value.

4. The image processing device according to claim 1, wherein the calculation unit calculates a statistical quantity that relates to the brightness of the internal area and/or the external area, and determines the matching position, the matching position candidate, or the erroneous matching position based on comparison of the statistical quantity and a certain threshold value.

5. The image processing device according to claim 1, wherein the calculation unit obtains a profile that indicates a change in brightness in the internal area and/or the external area, and determines the matching position, the matching position candidate, or the erroneous matching position based on comparison of the profile and a certain profile.

6. A pattern matching method in which pattern matching is performed on an image using a template that is formed based on design data, the pattern matching method comprising:
performing the pattern matching of the template based on an image of a semiconductor including a plurality of layers and the design data for the plurality of layers corresponding to the semiconductor including the plurality of layers in the image;
obtaining a characteristic quantity of the image in an area of interest by removing an area corresponding to an edge portion for an internal area and/or an external area that is segmented by line segments that define a contour of a pattern of the edge portion; and
determining a position in which the characteristic quantity satisfies a certain condition as a matching position, a matching position candidate, or an erroneous matching position.

7. The pattern matching method according to claim 6, wherein a position in which variation in brightness of the internal area and/or the external area satisfies a certain condition is determined as a matching position, a matching position candidate, or an erroneous matching position.

8. The pattern matching method according to claim 7, wherein the matching position, the matching position candidate, or the erroneous matching position is determined based on comparison of a parameter that indicates the variation in brightness and a certain threshold value.

9. The pattern matching method according to claim 6, wherein a statistical quantity that relates to the brightness of the internal area and/or the external area is calculated, and the matching position, the matching position candidate, or the erroneous matching position is determined based on comparison of the statistical quantity and a certain threshold value.

10. A non-transitory tangible machine-readable medium having a computer program that causes a calculation device to perform pattern matching on an image using a template that is formed based on design data, the computer program, when executed, causing the calculation device to perform the following steps:
performing the pattern matching of the template based on an image of a semiconductor including a plurality of layers and the design data for the plurality of layers corresponding to the semiconductor including the plurality of layers in the image;
obtaining a characteristic quantity of the image in an area of interest by removing an area corresponding to an edge portion for an internal area and/or an external area that is segmented by line segments that define a contour of a pattern of the design data; and
determining a position in which the characteristic quantity satisfies a certain condition as a matching position, a matching position candidate, or an erroneous matching position.

11. The non-transitory tangible machine-readable medium according to claim 10, wherein the program causes the calculation device to determine a position in which variation in brightness of the internal area and/or the external area satisfies a certain condition as a matching position, a matching position candidate, or an erroneous matching position.

12. The non-transitory tangible machine-readable medium according to claim 11, wherein the program causes the calculation device to compare a parameter that indicates the variation in brightness and a certain threshold value, and determine the matching position, the matching position candidate, or the erroneous matching position based on the comparison.

13. The non-transitory tangible machine-readable medium according to claim 10, wherein the program causes the calculation device to calculate a statistical quantity that relates to the brightness of the internal area and/or the external area, and determine the matching position, the matching position candidate, or the erroneous matching position based on comparison of the statistical quantity and a certain threshold value.

14. The non-transitory tangible machine-readable medium according to claim 10, wherein the program causes the calculation device to obtain a profile that indicates change in brightness of the internal area and/or the external area, and determines the matching position, the matching position candidate, or the erroneous matching position based on comparison of the profile and a certain profile.

* * * * *